United States Patent [19]

Hauck

[11] Patent Number: 4,626,829
[45] Date of Patent: Dec. 2, 1986

[54] DATA COMPRESSION USING RUN LENGTH ENCODING AND STATISTICAL ENCODING

[75] Inventor: Edward L. Hauck, Lafayette, Colo.

[73] Assignee: Intelligent Storage Inc., Longmont, Colo.

[21] Appl. No.: 767,186

[22] Filed: Aug. 19, 1985

[51] Int. Cl.⁴ .................................. H03K 13/00
[52] U.S. Cl. .......................... 340/347 DD; 358/260
[58] Field of Search ............... 340/347 DD; 358/260, 358/261; 364/200, 900; 382/56; 375/19

[56] References Cited

U.S. PATENT DOCUMENTS

| | | | |
|---|---|---|---|
| 2,853,698 | 9/1955 | Nettleton et al. | 364/200 |
| 3,016,527 | 1/1962 | Gilbert et al. | 340/347 |
| 3,394,352 | 7/1968 | Wernikoff et al. | 364/900 |
| 3,400,380 | 9/1968 | Packard et al. | 364/900 |
| 3,535,696 | 10/1970 | Webb | 364/900 |
| 3,587,088 | 6/1971 | Franaszek | 340/347 DD |
| 3,618,047 | 11/1971 | Hertz | 364/900 |
| 3,643,226 | 2/1972 | Leixides et al. | 364/900 |
| 3,694,813 | 9/1972 | Loh et al. | 364/900 |
| 3,717,851 | 2/1973 | Cocke et al. | 364/900 |
| 3,873,977 | 3/1975 | McIntosh | 340/347 DD |
| 4,021,782 | 5/1977 | Hoerning | 364/900 |
| 4,031,515 | 6/1977 | Kashio | 364/200 |
| 4,031,516 | 6/1977 | Kashio | 364/200 |
| 4,038,652 | 7/1977 | Schippers | 340/347 DD |
| 4,053,930 | 10/1977 | Ogawa | 358/260 X |
| 4,091,456 | 5/1978 | Ehresman et al. | 364/900 |
| 4,121,259 | 10/1978 | Preuss et al. | 358/261 |
| 4,122,259 | 10/1978 | Langdon, Jr. et al. | 340/347 DD |
| 4,131,940 | 12/1978 | Moyer | 364/200 |
| 4,141,005 | 2/1979 | Bonner et al. | 340/347 DD |
| 4,145,686 | 3/1979 | McMurray et al. | 340/347 DD |
| 4,161,757 | 7/1979 | Spencer et al. | 358/261 |
| 4,168,513 | 9/1979 | Hains et al. | 358/261 |
| 4,192,010 | 3/1980 | Kerner et al. | 364/900 |
| 4,276,597 | 6/1981 | Dissly et al. | 364/200 X |
| 4,295,124 | 10/1981 | Roybal | 340/347 DD |
| 4,316,222 | 2/1982 | Subramaniam | 358/261 |
| 4,342,081 | 7/1982 | Dubuc | 364/200 |
| 4,410,916 | 10/1983 | Pratt et al. | 358/261 X |
| 4,420,771 | 12/1983 | Pirsch | 358/261 |
| 4,464,650 | 8/1984 | Eastman et al. | 340/347 DD |
| 4,494,150 | 1/1985 | Brickman et al. | 358/260 |

FOREIGN PATENT DOCUMENTS 2361234 10/1972 Fed. Rep. of Germany ...... 358/261

*Primary Examiner*—William M. Shoop, Jr.
*Assistant Examiner*—Sharon D. Logan
*Attorney, Agent, or Firm*—Robert C. Dorr

[57] ABSTRACT

A compression device which uses both run length encoding and statistical encoding. The run length encoding scheme uses a flag byte symbol which is disposed between a character signal and a run length symbol. The statistical encoding process uses multiple statistical encoding tables which are selected based upon previously occurring data.

17 Claims, 8 Drawing Figures

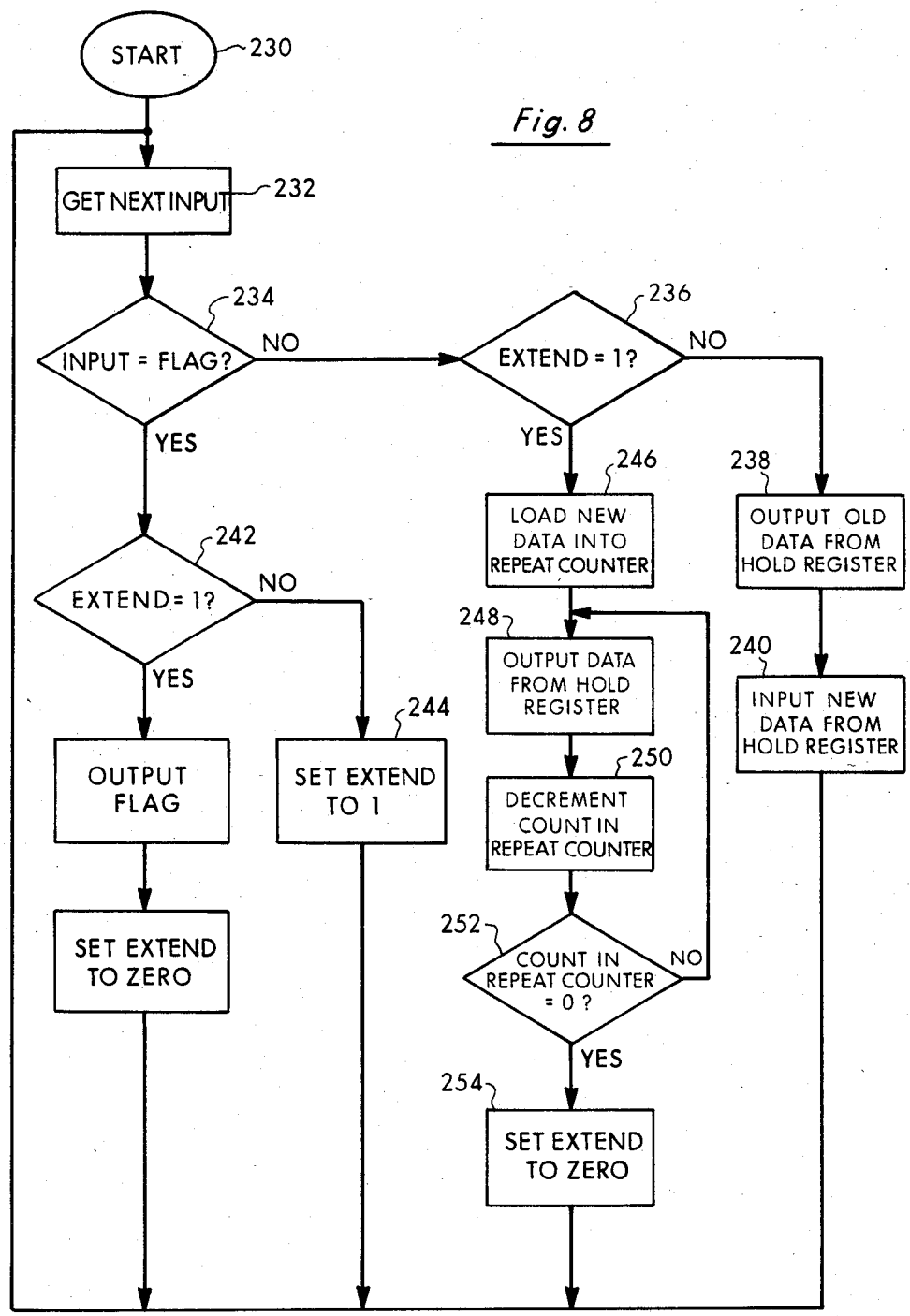

DATA COMPRESSION USING RUN LENGTH ENCODING AND STATISTICAL ENCODING

BACKGROUND OF THE INVENTION

1. Field of Invention

The present invention pertains generally to data processing and more particularly to data compression.

2. Description of the Background

Various methods of compressing data have been developed over the past few years. Because of the increased use of computer systems, requirements for storage of data has consistently increased. Consequently, it has been desirable to compress data for the purpose of speeding both transmission and storage of the data. Additionally, data compression reduces the physical space required to store data.

Of the data compression techniques developed in the prior art, two techniques appeared to be of particular importance to the present invention. The first technique is known as run length encoding wherein a series of repetitive data symbols are compressed into a shorter code which indicates the length of a code and the data being repeated. A large number of different ways of run length encoding have been developed. However, most methods require buffering of data to look ahead in the data stream to determine when a run (i.e., a series of repetitive characters) exists.

Statistical encoding techniques comprise techniques for characterizing data according to its statistical probability of occurrence. Data with a higher probability of occurrence is encoded with a shorter code than data having a lesser probability of occurrence. For example, the American National Standard Code for Information Interchange (ASCII) and the Extended Binary Coded Decimal Interchange (EBCDIC) comprise standard formatting schemes in which numbers, letters, punctuation, carriage control statements and other data are assigned various hexidecimal positions in a data formatting scheme using 8-bit bytes. These alphanumeric symbols, which are assigned different positions depending upon the standard used, have differing probabilities of occurrence. Since a "space" or an "e" has a much higher probability of occurrence than a "y" or a "z" or other nonfrequently occurring hexidecimal numbers, the "space" or "e" is encoded into a code of a lesser number of bits, e.g., 3 or 4 bits, rather than the standard 8 bit per byte code for these alphanumeric symbol. On the other hand, alphanumeric symbols such as "y" and "z" that have a much lower probability of occurrence are encoded into a code having more bits than the standard 8 bit byte code used in ASCII and EBCDIC standards, e.g., "y" and "z" may have 11 bits.

This concept of statistical encoding was first introduced by David A. Huffman, "A Method for Construction of Minimum-Redundancy Code," Proceedings of the IRE, Volume 40, Pages 1098-1101; September, 1952. This article describes a method of obtaining maximum entropy for a given database by examining the probability of occurrence of data in the database.

Huffman statistical encoding techniques are also disclosed by George Grosskopf, Jr. "Generating Huffman Codes," Computer Design, June 1983, pages 137-140. Both of these citations are specifically incorporated herein by reference for all that they disclose.

The "Huffman Code" generated as a result of the statistical encoding employed, is a code which can be uniquely identified as it is read in a serial fashion. In other words, the encoded data is uniquely arranged so that no ambiguity exists in identifying a particular encoded word as the bits of the code are read in a serial fashion. Consequently, flagging signals and other extraneous data is not required in the encoded database.

A problem with the Huffman statistical encoding technique is that the statistical probability of occurrence of particular alphanumeric symbols in any database will be different depending upon the data in the database, the formatting technique used (i.e., ASCII, EBCDIC, or other formatting technique), the nature of the database and various other factors. Several techniques have been used to overcome these disadvantages. For example, one technique which has been used is to study the particular database to be encoded and generate a statistical encoding table for each particular database. The disadvantage of this technique is that the database must be read and studied prior to statistical encoding and cannot, therefore, be encoded as the data is received for the first time.

Another technique which has been used is to study large quantities of data to produce a statistical encoding table which is generally applicable to most databases. Although compression of data can be achieved to some extent, in many cases the data is expanded because the particular database does not match the statistical probability set forth in the generic table used to encode the data. Additionally, maximum compression and maximum entropy of the data encoded is not achieved with this sort of generic database.

A pre-examination search was performed for the present invention. Several references, set forth below, were uncovered which have particular pertinence to the present invention:

| U.S. Pat. No. | Inventor | Date |
| --- | --- | --- |
| 3,587,088 | Franaszek | Jun. 22, 1971 |
| 4,420,771 | Pirsch | Dec. 13, 1983 |
| 4,316,222 | Subramaniam | Feb. 16, 1982 |
| 4,494,150 | Brickman et al. | Jan. 15, 1985 |
| 3,394,352 | Wernikoff et al. | July 23, 1968 |

The Franaszek patent discloses a multilevel pulse transmission system which employs codes having three or more alphabets. In accordance with the Franaszek disclosure, a binary pulse signal is converted for transmission into a pulse signal having n possible levels in accordance with the code having three or more alphabets. The input signal is divided into 4-bit words and converted to a multilevel signal using the first alphabet. The DC value of a multilevel signal is then measured. The DC sum value constitutes the average value of the data. If the DC sum value is equal to one, the code used is transmitted in the first alphabet. If the DC sum value is 4, the binary data is converted to the second alphabet. If the DC sum value of the first alphabet is 2 or 3, the binary data is converted to the third alphabet.

Although the Franaszek reference uses multiple tables for encoding, Franaszek requires data to first be encoded with a first alphabet to determine the proper alphabet to use for encoding. In other words, each byte must first be studied to determine its DC sum value prior to selecting the proper alphabet to be used for encoding.

The Pirsch patent discloses a run length encoding technique for multilevel signals. The Pirsch technique is particularly well-suited for video encoder applications wherein error values are produced based upon a picture element predictive technique. The frequently occurring values comprise a zero error signal. Pirsch divides the input data into 9-bit words and then divides these 9-bit words into two groups comprising frequently occurring signals and nonfrequently occurring signals. Frequently occurring signals comprise 9 zero bits. Nonfrequently occurring signals comprise anything other than 9 zero bits. Pirsch then determines the number of times the frequently occurring and nonfrequently occurring signals are produced to provide a run length signal. Statistical encoding techniques are also used to encode the run length number for frequently occurring signals. Statistical encoding techniques are also used to encode the run length number for nonfrequently occurring signals.

The Pirsch patent uses statistical encoding of run length encoded data and uses statistical encoding with two different tables depending upon whether the data consists of frequently or nonfrequently occurring data. As in Franaszek, the presently occurring data is analyzed to perform grouping into frequently and nonfrequently occurring data. Consequently, Pirsch studies and analyzes the data, as does Franaszek, prior to statistically encoding the data. The process of studying data requires extra hardware implementation and is time consuming because of the decision process which must take place during the statistical encoding process.

The Subramaniam patent discloses compression and decompression of digital image data using run length encoding and Huffman statistical encoding. The data is grouped into WB and BW runs. Symbols are generated indicating the length of each of the runs. The symbols are then statistically encoded using statistical data stored in a PROM. The binary data of the symbol constitutes an address in the PROM which stores the statistical data. A special symbol is generated to indicate a change from a WB to a BW run, and vice versa.

Subramaniam is similar to Franaszek and Pirsch in that the data is studied and grouped into WB and BW runs prior to statistical encoding. Again, this is a slow process and requires additional hardware implementation.

The Brickman et al. patent discloses methods of compressing data for text processing. Brickman discloses a system wherein each word received is compared with a word library. If the word is found in the library, only the word address is transmitted. If the word is not found, it is added to the library.

The Wernikoff patent discloses a data compression technique wherein data words are encoded by a plurality of encoders. The Wernikoff system then determines the encoder that provides the most compression of the signal to be transmitted. Tagging symbols are transmitted to identify the type of encoding used. This technique is implemented in a facsimile transmission run length encoding scheme.

Wernikoff et al. requires studying of the data to determine which table has produced maximum compression. Additionally, Wernikoff requires the use of tagging symbols as part of the data to indicate the encoding table used so that the data can be decoded.

Consequently, the prior art has failed to show a system for compression of data using both run length encoding and statistical encoding which minimizes implementation of hardware, maximizes compression and does not require analyzation of the current data to determine the statistical encoding technique to be used to statistically encode the data.

SUMMARY OF THE INVENTION

The present invention overcomes the disadvantages and limitations of the prior art by providing a data compression system which employs both run length encoding and statistical encoding in a manner which speeds processing and minimizes implementation of hardware to produce a highly compressed data output. The present invention may therefore comprise a system for compressing data having alphanumeric symbols encoded from binary data comprising, run length encoder for encoding alphanumeric signals to produce run length encoded data having a character byte indicating a repeated character, a flag byte indicating the existence of a run and a run length byte indicating the number of the repeated characters, and a statistical encoder for statistically encoding the run length encoded data in accordance with one of several statistical encoding tables selected by a pointer signal produced during statistical encoding of previous run length encoded data, and for generating a pointer signal to select a statistical encoding table for subsequent run length encoded data.

The present invention may also comprise a method of compressing byte formatted data comprising the steps of, run length encoding the byte formatted data to produce a data stream of run length encoded bytes having a character byte indicating a repeated byte of the byte formatted data, a flag byte indicating the existence of the repeated byte in the run length encoded data, and a run length byte indicating a number of repeated bytes in a run of the run length encoded bytes, statistically encoding the data stream of the run length encoded bytes by a plurality of statistical encoding compression tables having statistical encoding data stored therein for statistically encoding the run length encoded bytes in accordance with predetermined classifications of the run length encoded bytes, and, selecting a specified statistical encoding compression table of the plurality of statistical encoding tables for a current run length encoded byte based upon a specified classification of a previous run length encoded byte which is chronologically previous to the current run length encoded byte in the data stream of the run length encoded bytes.

The advantages of the present invention are that a run length encoding scheme is used wherein the run length encoded data comprises a character byte, a flag byte and a run length byte, in that order. Since the flag byte is between the character byte and run length byte, the run length byte and character byte can be directly loaded into a register without buffering during the decoding process for both forward and reverse reading of the data. Also, during the encoding process, runs are generated by comparison of successive symbols, rather than buffering an entire run to determine a beginning and ending point. This greatly reduces the amount of hardware required and allows the data to be processed in a rapid manner.

This statistical encoding technique of the present invention does not require analyzation of a current data point to select a statistical encoding technique, but rather, uses prior data to indicate the technique to be used. In this manner, multiple statistical encoding tables can be used to optimize compression of data and produce minimum redundancy. Hence, the Huffman encoding technique used in the present invention is nonambiguous and the order of the data inherently includes the statistical technique to be used for decoding. This eliminates the necessity for tagging signals of the data to indicate the decoding system to use, which would otherwise expand the encoded database.

BRIEF DESCRIPTION OF THE DRAWINGS

An illustrative and presently preferred embodiment of the invention is shown in the accompanying drawings, wherein:

FIG. 8 is a schematic flow diagram illustrating the manner of operation of the combinational logic device of FIG. 7.

DETAILED DESCRIPTION OF THE PREFERRED EMBODIMENT OF THE INVENTION

Figure 1:
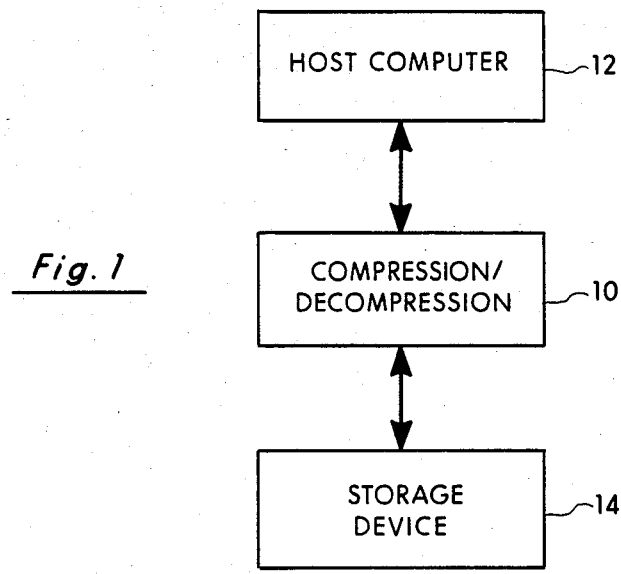
FIG. 1 is a schematic block diagram illustrating the manner in which the compression/decompression techniques of the present invention can be employed.

FIG. 1 is a schematic block diagram illustrating the manner in which the compression/decompression system 10 of the present invention can be employed in the transfer of data from a host computer 12 to a storage device 14 and vice versa. Although FIG. 1 illustrates one implementation of the present invention, the present invention can also be employed to compress and/or decompress data in any data translation or transmission system desired. For example, the present invention can be used to compress and/or decompress data in a data transmission system for a facsimile system between two remote locations. Additionally, the present invention can be used for compressing and/or decompressing data during transmission of data within a computer system.

Figure 2:
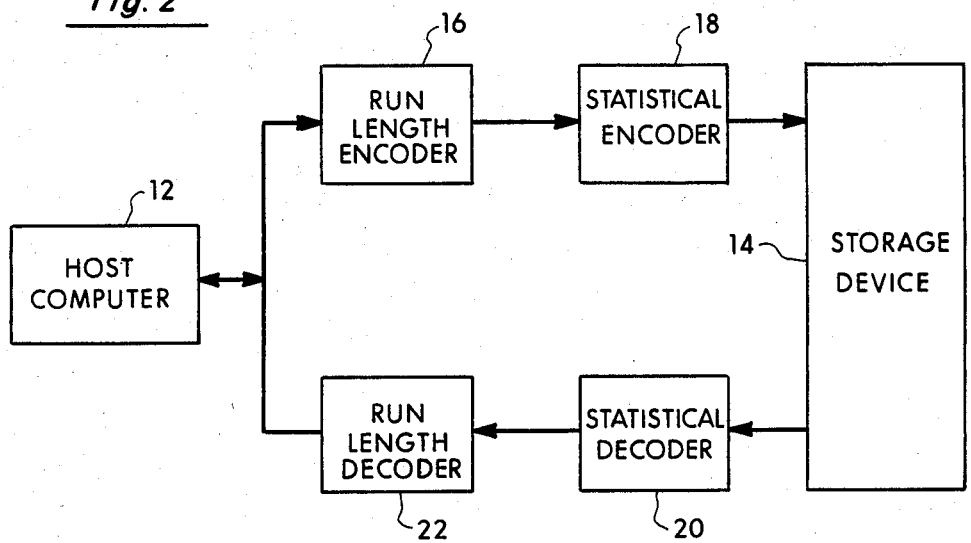
FIG. 2 is a schematic block diagram further defining the manner in which the present invention can be employed.

FIG. 2 is a schematic block diagram illustrating the manner of compression and decompression used in the present invention. Compression is accomplished, in accordance with the present invention, by run length encoding in a run length encoder 16. The run length encoded data produced at the output of run length encoder 16 is then statistically encoded in statistical encoder 18. The decoding process of the present invention is accomplished by statistically decoding the statistical encoded data in statistical decoder 20. The statistical decoded data from statistical decoder 20 is then run length decoded in run length decoder 22.

Run length encoder 16 comprises the first stage in the compression process. Run length encoder 16 scans the data for characters which repeat themselves in the data stream from host computer 12 and replaces any detected runs of repeated characters with a repetition group comprising:

x G n where:

x is the character repeated;

G (gamma) is a flag character indicating the existence of a run; and, n is the number of repetitions of the character in the run (i.e., the run length).

The data stream from host computer 12 comprises byte formatted data usually consisting of 8-bit bytes. Each of the 8-bit bytes, ranging from 0 to 256 (0 to FF in hexidecimal), is assigned a specific alphanumeric character which can comprise a number, letter, punctuation, carriage control statement or other function. Formatting schemes such as ASCII and EBCDIC are used to assign the alphanumeric character positions within the range of 0 to FF in hexidecimal.

Since the flag byte must comprise one of the data points in the range of data from 0 to FF, confusion and ambiguity would exist if the flag byte appeared in the data stream from host computer 12. In fact, this is one of the reasons why the run length encoding technique utilized in the present invention has not been used in the prior art.

A detailed study was made of a large number of databases using various formatting schemes to select a symbol which rarely appears in the data to be compressed and which has a fairly high value to allow for long run lengths. The studies have indicated that the values in the range of FA to FF hexidecimal are good choices with either FD or FE being the best. If FD is chosen as the symbol for the flag byte, legal values for n are from 3 to FC. Values of less than 3 are not allowed since no data compression is attained and those larger than FC are not allowed since they would be mistaken for the flag byte. Allowing a repetition count of 3 when no compression is realized reduces the complexity of the hardware by decreasing the look ahead requirements of the algorithm.

To overcome the pathological case of the remote possibility of FD (the selected flag byte G) occurring in the byte formatted data stream from host computer 12, a technique has been devised in accordance with the present invention for distinguishing this data from the flag byte. In the event that a flag byte appears in the data stream from host computer 12 it is replaced with 2 flag bytes (FD FD) to distinguish data from a repetition group in manner which is easy to detect in hardware with a minimum of buffering. If a data stream is encountered which consists entirely of flag bytes, 100% expansion of the database will occur, i.e., the database will be twice the size of the original database. To reduce the likelihood of the expansion, the number of bits selected for the flag byte in statistical encoder 18 is artifically set at 4-bits in an 8-bit per byte database. By assigning the flag byte half of the number of bits of a standard byte, a double flag byte does not expand the database whatsoever. Consequently, if an entire stream of flag bytes exists in the data stream from host computer 12, which is a highly unlikely occurrence, expansion of the data from statistical encoder 18 will not result.

Additionally, since the flag byte is always surrounded by the character symbol (x) or the run length number (n), a double flag byte can always be distinguished during decompression from a flag byte in the raw data.

The statistical encoder 18 uses a Huffman encoding technique disclosed by Huffman, supra, to transform each symbol to a code having a varying number of bits per byte depending upon the probability of occurrence to produce a nearly maximum information density signal (i.e., a signal having maximum information entropy).

This is acheived by encoding each symbol received from run length encoder 16 with a variable length transformation of which the length is a function of the degree of probability of appearance of that particular character. As an example, consider the following binary code of 4-bits with a non-linear distribution of probability, as set forth in Table 1.

TABLE 1

| Symbol | Probability | # bits | Weight | Encoded Data |
|--------|-------------|--------|--------|--------------|
| 0000 | .25 | 2 | .50 | 10 |
| 0001 | .20 | 2 | .40 | 00 |
| 0010 | .10 | 3 | .30 | 010 |
| 0011 | .10 | 3 | .30 | 011 |
| 0100 | .10 | 4 | .40 | 1100 |
| 0101 | .05 | 5 | .25 | 11010 |
| 0110 | .05 | 5 | .25 | 11011 |
| 0111 | .05 | 5 | .25 | 11100 |
| 1000 | .02 | 6 | .12 | 111010 |
| 1001 | .02 | 6 | .12 | 111011 |
| 1010 | .01 | 6 | .06 | 111100 |
| 1011 | .01 | 6 | .06 | 111101 |
| 1100 | .01 | 7 | .07 | 1111100 |
| 1101 | .01 | 7 | .07 | 1111101 |
| 1110 | .01 | 7 | .07 | 1111110 |
| 1111 | .01 | 7 | .07 | 1111111 |

Any data set which has a probability distribution which matches the probability distribution set forth in Table 1 will be compressed by 18% when operated on by the Huffman code. The weight value of the symbol is the product of the probability of occurrence of the symbol in the data stream and the number of bits. The weight value of each character indicates an average contribution of that character to the statistically encoded data. The sum of the weights, as illustrated in Table 1, is 3.29. By dividing the total number of bits, i.e., 4, by the sum of the weights, a value of 0.82 is obtained. This number, subtracted from 1, gives the percentage of compression produced by statistically encoding the data, i.e., 1.00−0.82=0.18 or 18% compression.

Optimum Huffman encoding can be achieved for every record compressed if the data is pre-scanned and a unique vocabulary or translation table is assigned from the resulting probabilities. As pointed out in the background of the invention, there are a number of disadvantages and limitations to studying the data in this manner prior to statistical encoding. Some of these disadvantages include the necessity of using peripheral devices, the inability to scan the entire record prior to statistical encoding and the expansion of data resulting from storing unique translation tables for each record, which can run as large as 500 bytes. As also set forth in the background of the invention, by studying large amounts of data, a generic vocabulary can be created which will work well for a majority of records although it is not optimum for any given one.

To optimize the statistical encoding process for a database having a large range of data characteristics, the present invention uses a plurality of translation tables which are each specifically designed to optimize compression for certain types or classifications of data. For example, a generic translation table may be generated for general purpose data, while a numeric table may be generated to translate numeric data. Similarily, an EBCDIC table may be generated to translate EBCDIC data and a ASCII table may be generated to translate ASCII data. Consequently, various translation tables can be used to optimize the translation of different types or classifications of data.

The present invention utilizes a null table which does not statistically encode the data, but rather, produces an output which has the same number of bits as the input for each symbol. The null table provides one to one mapping of data. The weight of the statistical encoding vocabulary of a null table is 8. The present invention also uses a generic table which was created as a result of a study of large amounts of data. The generic table has a weight of approximately 6.4, resulting in a compression of 20% if data exactly matches that predicted by the study. The third table of the present invention is tuned to compress EBCDIC numbers (F0–F9 hexidecimal). The numeric table has a weight of 5.7 resulting in a compression of 28% if all of the symbols are numbers. Of course, these tables are only exemplary of the manner of implementing the present invention and other suitable tables can be used to employ the concepts of the present invention.

Since only one table of the three tables can be used to compress any given input byte and the procedure for determining which table to use is fixed, so as to allow deterministic decoding, the basic strategy of statistical encoding is to remain in the generic table as long as a current byte in the stream of data bytes is compressing well and is not an EBCDIC number (F0–F9 hex). If the symbol expands badly in the generic table, the next symbol is directed to the null table and the statistical encoding process remains in the null table until the null table indicates that compression would result in another table. If a number is encountered, the data stream is directed to the numeric table and remains in the numeric table as long as numbers are being encoded.

The manner of selecting the statistical encoding table of the present invention is based on the concept that things tend to remain the same rather than change. This concept is demonstrably apparent in physics in the form of momentum and inertia. In accordance with the present invention, the translation table selected for a current byte is based upon a pointer signal which is generated during the statistical encoding process for the data byte chronologically immediately preceding the current data byte. In other words, the present invention relies upon data which is encoded previously to the current data in the data byte stream. This constitutes a fundamental difference over prior art devices which study the current data to select the statistical encoding process to be used for the current data. In accordance with the present invention, selection information is available when data is read such that the encoding process is not delayed by the necessity to study the data.

The statistical encoding tables which are used in the present invention are adjusted from the anticipated probabilities of the data in two ways. As described above, although the occurrence of a flag byte (FD) in the raw data is extremely low, the probability of the flag byte in the statistical probabilities stored in the tables is raised to the point where it translates into a code having half of the number of bits of the alphanumeric symbol. For example, if the alphanumeric symbols comprise 8-bit bytes, the gamma is assigned a probability of occurrence in the statistical probability tables which translates to a 4-bit value so that the occurrence of a flag byte in the alphanumeric symbols received from host computer 12 causes the generation of two flag bytes (FD FD) from the run length encoder 16 resulting in a total of 8 bits, which does not cause expansion of the data. Consequently, the pathological case of the occurrence of a large number of flag bytes does not result in overall expansion of the data.

A second adjustment to the statistical probability stored in the tables is that no entry is allowed which is greater than a predetermined number of bits, e.g., 16 bits. This reduces the amount of hardware necessary for implementation of the statistical encoding tables.

Figure 3:
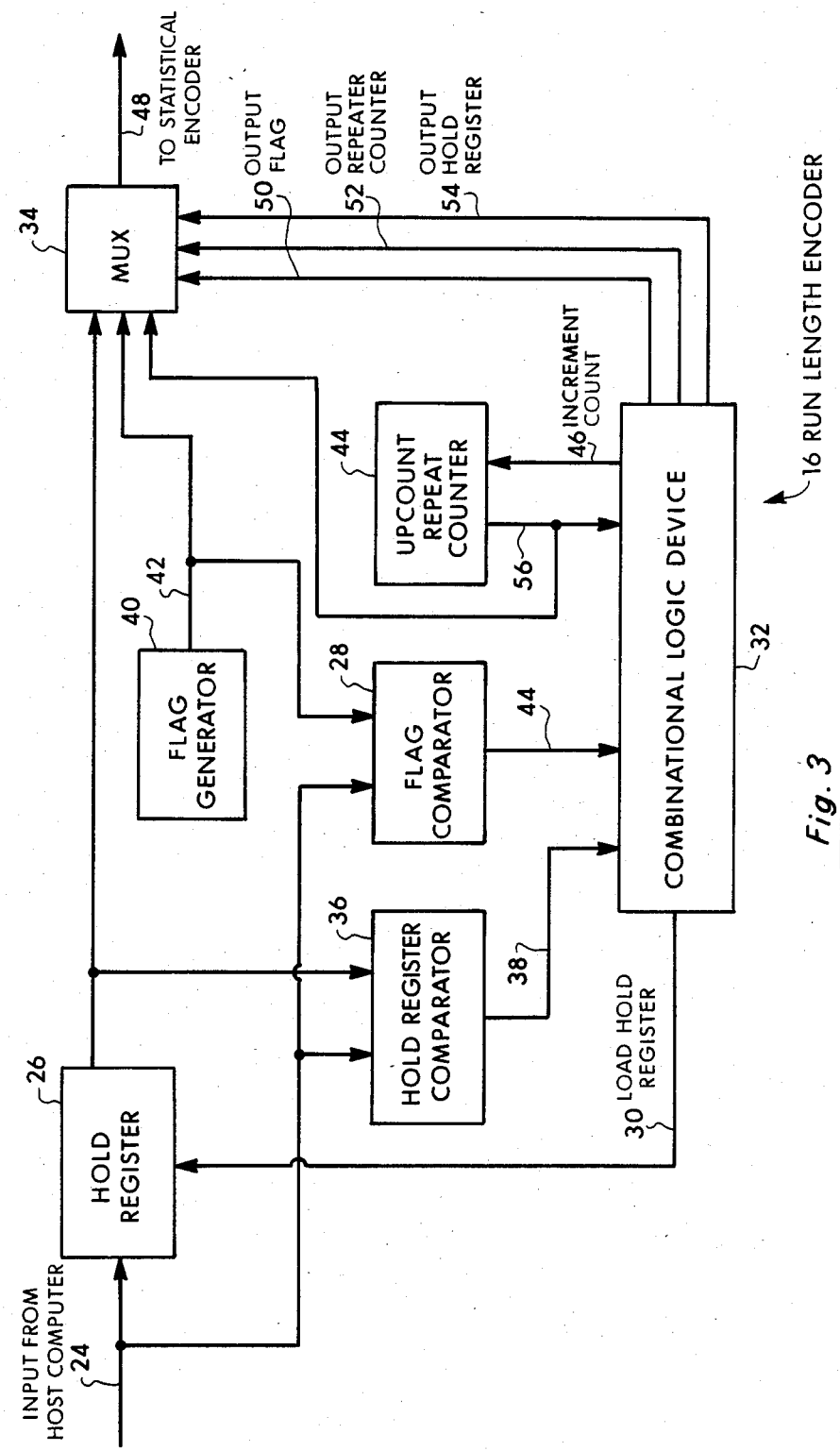
FIG. 3 is a schematic block diagram of a run length encoder.

FIG. 3 is a schematic block diagram of run length encoder 16. Input 24 from host computer 12 is applied to hold register 26 and flag comparator 28. Input 24 comprises a stream of byte formatted bits normally encoded as alphanumeric symbols in accordance with a formatting schemes such as EBCDIC or ASCII. Load hold register signal 30 produced by combinational logic device 32 functions to load the alphanumeric symbols from input 24 to hold register 26 and output the data in hold register 26 to multiplexer 34 and hold register comparator 36. Hold register comparator 36 compares the current data received from input 24 with the chronologically immediately preceding data which is output by hold register 26. If the current data and previous data are the same, hold register comparator 36 produces an output 38 which is applied to combinational logic device 32.

Flag generator 40 produces a flag output 42 which comprises an alphanumeric output used in the run length encoding process as the flag byte. The flag output is applied to flag comparator 28 and multiplexer 34. Flag comparator 28 compares the input byte 24 with the flag byte to produce an output 44 upon favorable comparison. Output 44 and flag comparator 28 are also supplied to combinational logic device 32. Upcount repeater counter 44 receives an increment count 46 produced by combinational logic device 32 to increment the count in upcount repeater counter 44. Increment count signal 46 is produced in response to the generation of a comparison signal 38 from hold register comparator 36. Multiplexer 34 produces an output 48 comprising one of the input lines from hold register 26, flag signal 42 or increment count signal 56 in response to control signals produced by combinational logic device 32.

Output flag control signal 50 is produced by combinational logic device 32 and applied to multiplexer 34 to cause output 42 of flag generator 40 to be passed through multiplexer 34 to output 48. Output repeater counter control signal 52 causes the output 56 from the upcount repeater counter 44 to be passed through the multiplexer 34 to output 48. Output hold register control signal 54 causes the output of hold register 26 to be passed through multiplexer 34 to output 48. Output 48 is applied to the statistical encoder illustrated in FIG. 5. Combinational logic device 32 can comprise any suitable means for processing these data including a microprocessor or state logic machine.

Figure 4:
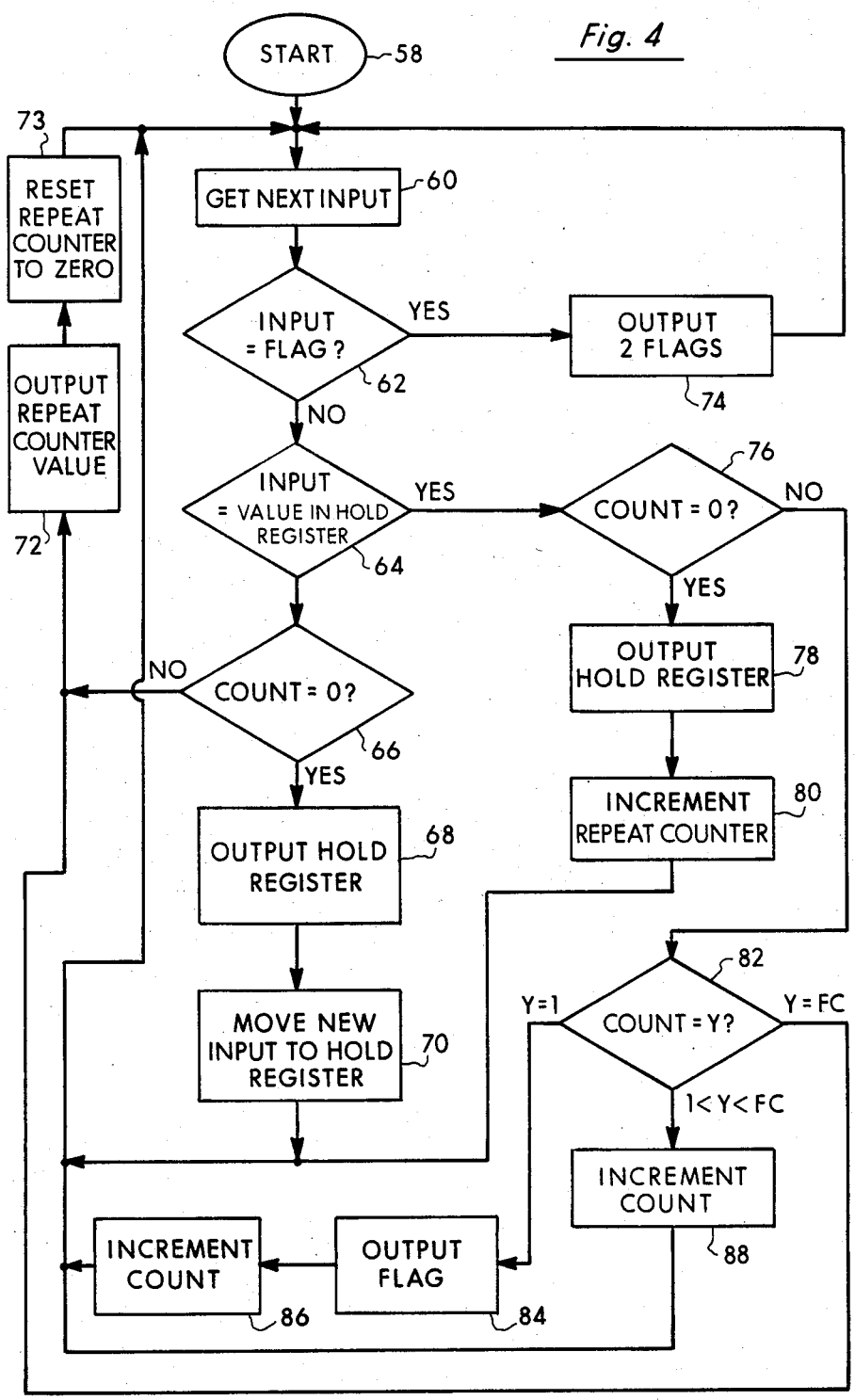
FIG. 4 is a schematic flow diagram illustrating the manner of operation of the combinational logic device of FIG. 3.

FIG. 4 is a flow diagram of the functions performed by the combinational logic device 32 illustrated in FIG. 3. Referring to FIG. 4, combinational logic device 32 starts at instruction 58. From there, it proceeds to get the next input at instruction 60. A determination is then made whether the input is equal to a flag at decision block 62. If the input is not equal to a flag, a determination is made at decision blocks 64 if the input is equal to the value in the hold register. If is not, a decision is made at decision block 66 if the count in the upcount repeater counter 44 is equal to 0. If the count in the upcount repeater counter 44 is equal to 0, the contents of hold register 26 are passed through multiplexer 34 to output 48, at instruction block 68, in response to output hold register control signal 54. Additionally, load hold register signal 30 is applied to hold register 26 to load input 24 into hold register 26 at instruction block 70. The program is then recirculated to get the next input at instruction block 60. If it is determined at decision block 66 that the count is upcount repeater counter 44 is not equal to 0, then output 56 of upcount repeater counter 44 is passed through multiplexer 34 in response to output repeater counter control signal 52 at instruction block 72. The repeat counter is then reset to zero at instruction block 73.

If it is determined at decision block 62 that the input is equal to a flag, output flag control signal 50 causes multiplexer 34 to output two flag bytes (FD FD) from flag generator 40 at instruction block 74.

If it is determined at decison block 64 that the input is equal to the value in the hold register, the program proceeds to decision block 76 to determine if the count in the upcount repeater counter 44 is equal to 0. If it is, then two identical symbols have been encountered sequentially which is not enough to start a run. Consequently, the contents of hold register 26 is passed in multiplexer 34 to output 48 in response to output hold register control signal 54 at instruction block 78. Additionally, an increment count 46 is generated to increment the count in upcount repeater counter 44 to a value of one. The program then returns to get the next input at instruction block 60.

If it is determined at decision block 76 that the count in upcount repeater counter 44 is not equal to 0, then at least three repetitive characters have been encountered and the program proceeds to decision block 82 to determine if the count is equal to a predetermined value (y). If the predetermined value (y) is equal to one, a beginning of a run sequence has started and the program proceeds to block 84 to cause a flag to be generated at output 48. The program then proceeds to block 86 to increment the count in upcount repeater counter 44. The program then returns to obtain the next input at instruction blocks 60. If the predetermined count is greater than 1, but less than the value of the flag byte minus 1, i.e., FD−1=FC, then the program proceeds to increment the count in the upcount repeater counter 44 at instruction block 88. The program then returns to get the next input at instruction block 60. If it is determined at decision block 82 that the predetermined count in the upcount repeater counter 44 is equal to the flag byte minus 1 (FC) the run ended and the program proceeds to instruction block 72 to cause the output of upcount repeater counter 56 to be passed through multiplexer 34 to output 48. The program proceeds to instruction block 73 to reset the repeat counter to zero. The program then returns to instruction block 60 to obtain the next input. In this manner, a run length encoded signal is generated having a format "x G n" where "x" is the character byte, "G" is the flag byte and "n" is the number or length of the run.

Figure 5:
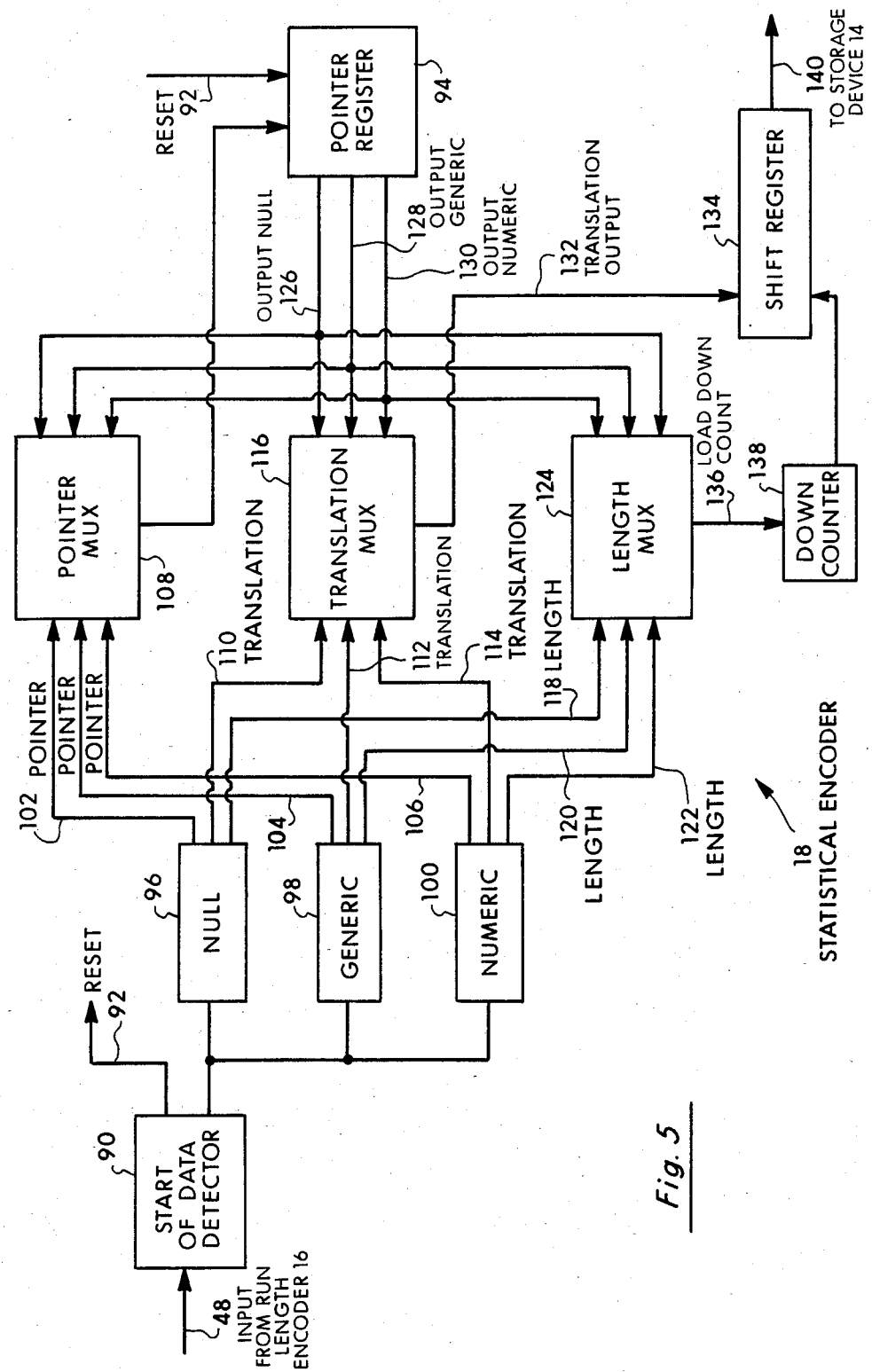
FIG. 5 is a schematic block diagram of a statistical encoder.

FIG. 5 is a schematic block diagram of the statistical encoder 18. Statistical encoder 18 receives an input 48 from the run length encoder which is applied to a data detector 90 which detects the start of the data. At the start of the data, detector 90 generates a reset signal 92 which is applied to pointer register 94. The input data 48 from the run length encoder is applied in parallel to three statistical encoding tables comprising a null table 96, a generic table 98 and a numeric table 100, which comprise lookup tables having statistical encoding data stored therein at address locations corresponding to the input data 48. The manner in which statistical encoding data is generated for the tables of the present invention is described above. In addition to the statistical encoding data stored in the null, generic and numeric translation tables, pointer signals are also stored at the address location of the input data 48 for each statisticaly encoded data byte addressed by input 48. Pointer signals 102, 104, 106 produced by the null, generic and numeric tables, respectively, are applied to pointer multiplexer 108. The translated data 110, 112, 114 produced by the null, generic and numeric tables, respectively, is applied to translation multiplexer 116. The null, generic and numeric tables also store length signals 118, 120, 122, respectively, at the address location of the pointer signals and the translated data for each data input address which are applied to length multiplexer 124. Length signals 118, 120, 122 indicate the length of the Huffman statistical code, i.e., the translated data produced on output 110, 112, and 114 from the null, generic and numeric tables, respectively.

Reset 92 is applied to pointer register 94 at the beginning of the data stream to produce a pointer signal on output null control signal line 126. The output null control signal is applied to translation multiplexer 116 to select the translation output data 110 from null table 96 to be applied to translation output 132 from translation multiplexer 116. This output is loaded into shift register 134. Simultaneously, output null control signal 126 is applied to length multiplexer 124 to cause length signal 118 to be transmitted to the load down count output 136 of length multiplexer 124. The length signal, which indicates the length of the translated data, is loaded into down counter 138 which shifts the output of shift register 134 until the down counter 138 reaches a 0 value. In this manner, the translation output 132 is shifted from shift register 134 on output 140 which is applied to the storage device 14. Hence, the compressed data which has been both run length encoded and statistically encoded is stored in the storage device 14.

Figure 6:
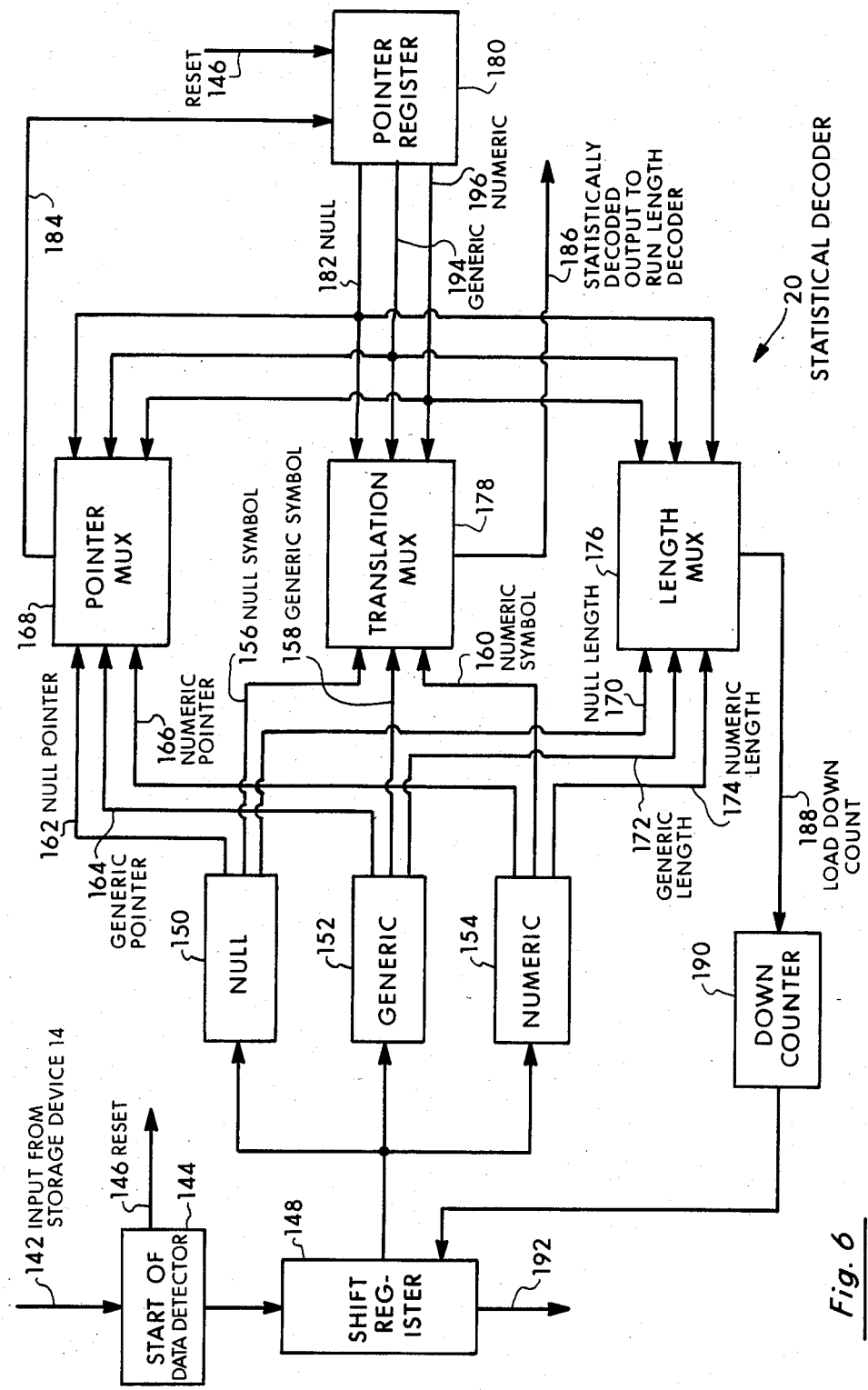
FIG. 6 is a schematic block diagram of a statistical decoder.
Figure 7:
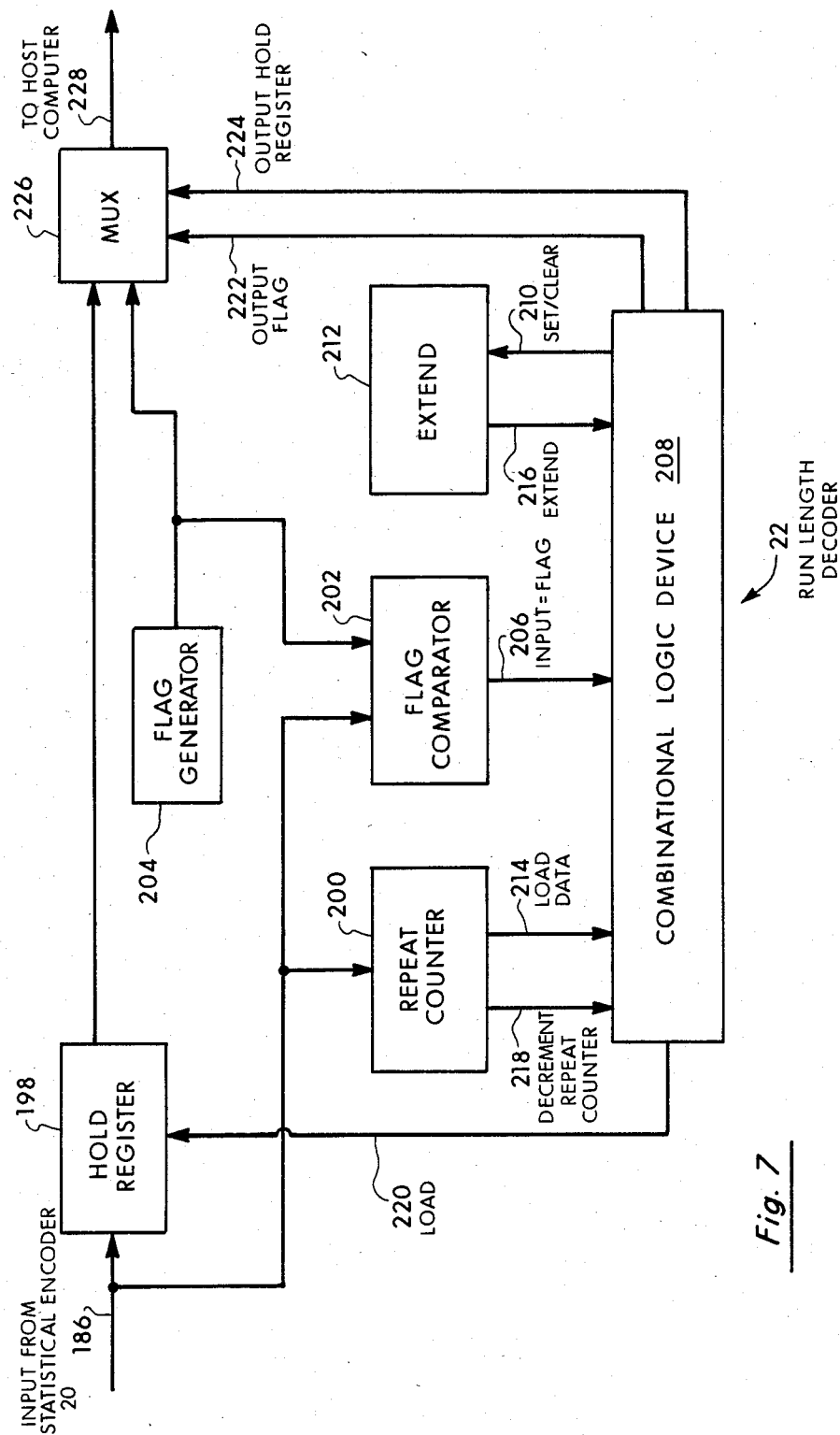
FIG. 7 is a schematic block diagram of a run length decoder.

The decompression process is illustrated in FIGS. 6 through 8.

FIG. 6 is a schematic block diagram of the statistical decoder 20. Compressed data from the storage device 14 is received by statistical decoder 20 via input 142. Data detector 144 detects the start of data received from storage device 14 and produces a reset signal 146 when data is initially detected. The input data is then loaded into shift register 148. Statistical decoding tables 150, 152, 154 have statistical decoding data stored therein at address locations corresponding to the data stored in shift register 148. The contents of shift register 148 is compared with address locations in null table 150, generic table 152 and numeric table 154 in a parallel fashion to generate decoded symbol outputs 156, 158, 160 corresponding to the statistically decoded data at the address locations addressed by the data stored in shift register 148. Additionally, pointer signals are also stored at these address locations for each of the decoding tables. The null translation table 150 produces a null pointer 162, the generic translation table 152 produces a generic pointer 164 and the numeric translation table 154 produces a numeric pointer 166, all of which are applied to pointer multiplexer 168. Also stored at the address locations are length signals which indicate the length of the decoded data. In this respect, null table 150 produces a null length signal 170, generic translation table 152 produces a generic length 172 and numeric translation table 154 produces a numeric length 174, all of which are applied to length multiplexer 176. Each of the statistically decoded symbols comprising null symbol 156, generic symbol 158 and numeric symbol 160, are applied to translation multiplexer 178.

Upon the receipt of data from storage device 14 at input 142, data detector 144 generates a reset signal 146 which is applied to pointer register 180. In response to reset signal 146, pointer register 180 generates a null pointer signal 182 which is applied to pointer multiplexer 168, translation multiplexer 178 and length multiplexer 176. Pointer multiplexer 168 channels the null pointer signal 162 through pointer multiplexer 168 to output 184 which is loaded into pointer register 180 for subsequent use.

Null pointer signal 182 is also applied to translation multiplexer 178 to cause the null symbol signal 156 to be transmitted through translation multiplexer 178 to statistically decoded output 186 which is applied to the run length decoder 22 illustrated in FIG. 7. Null pointer signal 182 is also applied to length multiplexer 176 causing the null signal 170 to be transmitted through length multiplexer 176 to output 188 which comprises a load signal for down counter 190. Down counter 190 is applied to shift register 148 to shift data out of shift register 148 via output 192. The data shifted from shift register 148 via output 192 is disposed of and no longer used.

The process described above is the initial process of decoding when data is first received from storage device 14. The first data received is always decoded in null statistical decoding table 150. In this manner, the order of decoding is fixed in the system. This is the same order which is used in the encoding process. This ensures correspondence between the order in which data is encoded and decoded. The pointer signal stored in null table 150 for the first data received is applied to null pointer 162 and channeled through pointer multiplexer 168 and output 184 and is stored in pointer register 180. This pointer signal is then used to produce a pointer signal output which can comprise a null pointer signal 182, a generic pointer signal 194 or a numeric pointer signal 196 for the next data received at input 142 from storage device 14. For example, if the pointer signal stored in the null table 150 for the first data byte decoded consisted of a generic pointer signal, the next data point would be statistically decoded in the generic decoding table 172, and the pointer signal stored for that data byte in generic translation table 152 would be loaded into pointer register 180 for the next data byte. If that data byte were a numeric signal, the generic table would generate a pointer signal to select the numeric table for a subsequent byte. This process continues on in the same manner so that each data input 142 received from storage device 14 is decoded in accordance with the pointer signal stored in the translation tables for the immediately preceding byte.

Although the present invention is based upon the generation of a pointer signal for the immediately preceding data byte for both statistical encoding and decoding, both the encoding and decoding process can be based upon one or more data bytes which are not immediately previous to the current data byte.

FIG. 7 is a schematic block diagram of the run length decoder 22. Input 186 from statistical decoder 20 is applied to hold register 198, repeat counter 200 and flag comparator 202. The statistically decoded data is in the form "x G n", as set forth above, wherein "x" is the character to be run length decoded, "G" is the flag byte and "n" is the length of the run. Flag compartor 202 compares the input 186 with the output of the flag generator 204 to determine if the input is a flag. If so, flag comparator 202 generates an output 206 which is applied to combinational logic device 208. Combinational logic device 208 produces a set signal 210 which "sets" extend counter 212 in response to receipt by combinational logic device 208 of a flag comparator signal 206, indicating that the input 186 comprises a flag signal. Repeat counter 200 receives a load data signal 14 to load the value of input 186 into the repeat counter whenever the run length number is received at input 186. Combinational logic device 208 produces the load data control signal 214 when the data is received at input 186 if a flag is not indicated at input 206 and the extend to register 212 is "set", as indicated by extend output 216. Repeat counter 200 uses a decrement repeat counter signal 218 to count down the value in repeat counter 200 to zero whenever the input data is not a flag and the extend register 212 is set. A clear signal is also produced on input 210 to reset the extend counter 212 to zero after repeat counter 200 is decremented to 0. Combinational logic device 208 produces a load signal 220 to read the contents of hold register 198 and load input 186 into hold register 198 when data is received and the input 206 to combinational logic device 208 does not indicate that the data is a flag. Combinational logic device 208 also produces an output flag control signal 222 and an output hold register control signal 224 which are applied to multiplexer 226. Output flag control signal 222 is generated by combinational logic device 208 to channel the output of flag generator 204 to output 228 whenever two flags are sequentially detected. Output hold register 224 is applied to multiplexer 226 to read the contents of hold register 198 at output 228 when two flag bytes are not detected, as further disclosed in FIG. 8.

FIG. 8 comprises a schematic flow diagram of the operation of combinational logic device 208. Combinational logic device 208 can comprise any desired device for carrying out the functions illustrated in FIG. 8, including a microprocessor or state logic machine. Referring to FIG. 8, the functions performed by combinational logic device 208 start at instruction block 230 and precede to instruction block 232 to get the next input byte from statistical decoder 20. The program then proceeds to decision block 234 to determine if the input is a flag. If it is not, the program then proceeds to decision block 236 to determine if the extend counter is set to 1. If it is not, then the data is read from hold register 198 in response to an output control signal 224 from combinational logic device 208, at instruction block 238. Load signal 220 is then produced by combinational logic device 208 to load data from input 186 into hold register 198 at instruction block 240. The program then returns to obtain the next input at instruction block 232. If it is determined at decision block 234 that the input is a flag, the program proceeds to decision block 242 to determine if the extend counter is set to 1. If the extend counter is not set at one, program proceeds to instruction block 244 to set the extend counter 212 to 1. The program then returns to obtain the next input at instruction block 232.

If it is determined at decision block 234 that the input is not a flag, and at decision block 236 that the extend register has been set at 1, indicating that the previous data signal was a flag, the program proceeds to instruction block 246 to load the value of the input 186 into the repeat counter 200 by a load control signal 214. Since the signal occurring after the flag byte (G) is the run length number (n), this number is loaded into the repeat counter 200 at instruction block 246 to count down the length of the run. The program then proceeds to instruction block 248 to generate an output on output hold register control signal 224 to read the contents of hold register 198. The count in repeat counter 200 is then decremented at instruction block 250. The program then proceeds to decision block 252 to determine if the count in the repeat counter 200 is equal to 0 if it is not, the program returns to instruction block 248 to read the contents of hold register 198. In this manner, the output of the hold register is repeated until the run length number is decremented to 0. If the count in repeat counter 200 is equal to 0, the program proceeds to instruction block 254 to set the extend counter 212 to 0 and return to obtain the next input at instruction block 232. In this manner, the run length encoded signal is decoded for transmission to host computer 12.

Consequently, the present invention provides a system for compressing data which uses both run length encoding and statistical encoding wherein a run length encoding scheme is used having a flag byte disposed between a run length byte and a character byte. This allows ease of implementation of the run length encoding scheme, fast processing of data for both encoding and decoding, and the elimination of ambiguities with respect to the pathological case wherein the flag byte occurs in the input data stream. The pathological case is eliminated in the present invention by the generation of a double flag byte whenever the flag byte appears in the data stream. Expansion of data as a result of generation of a double flag byte is eliminated by artificially assigning the number of bits in a flag byte to be half of the total number of bits in a byte of data, i.e., 4 bits in 8-bit per byte data. Ambiguity is also eliminated in the run length encoded data by placing the flag byte between the character byte and the run length byte. In this manner, the flag byte cannot be misinterpreted as a character byte.

The statistical encoding process utilizes lookup tables having statistical encoding data stored therein at address locations addressed by the input data. This provides a fast and easy to implement manner of generating statistically encoded data which does not require extensive processing. Optimization and greater entropy is provided by the use of multiple statistical encoding tables which are selected based on the classification of a previously occurring byte in the data stream. This is based on the concept of momentum or inertia in the data and eliminates the necessity for studying the data to select a statistical decoding process. This manner of selecting the decoding process also provides for a fast and easy manner of statistical decoding.

The foregoing description of the invention has been presented for the purpose of illustration and description. it is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to their particular use contemplated. It is intended that the appended claims be construed to include other alternative embodiments of the invention except insofar as limited by the prior art.

What is claimed is:

1. A system for compressing data comprised of information symbols encoded from binary data comprising:
   run length encoding means for encoding said information symbols to produce run length encoded data having a character symbol indicating a repeated information symbols, a flag symbol indicating the existence of a run, and a run length symbol indicating the number of said repeated information symbols;
   statistical encoding means for statistically encoding said run length encoded data in accordance with one of several statistical encoding tables selected by a pointer signal produced during statistical encoding of previous run length encoded data, and for generating a pointer signal to select a statistical encoding table for subsequent run length encoded data;
   means for detecting the occurrence of said information symbols in said data corresponding to said flag symbol; and,
   means for encoding said information symbols in said data corresponding to said flag symbol as a double flag symbol to distinguish said flag symbol from said information symbols in said data.

2. The system of claim 1 further comprising:
   means for statistically encoding said flag symbol to have a predetermined number of bits equal to half of the number of bits in a byte of said flag symbol.

3. The system of claim 2 wherein said several statistical encoding tables comprise:
   null table means for generating an output which is independent of statistical probabilities of occurrence of said information symbols in said data;
   generic table means for statistically encoding said data to maximize compression of letter character text;
   numeric table means for statistically encoding said data to maximize compression of numerical character text.

4. The system of claim 3 wherein said null table means, said generic table means and said numeric table means comprise lookup tables which store statistical translations of said run length encoded data at address locations corresponding to said run length encoded data and said pointer signals for selecting a statistical encoding table for said subsequent run length encoded data.

5. The system of claim 4 wherein said pointer signals provide a predetermined amount of hysteresis to said system to prevent thrashing between said statistical encoding tables by allowing a predetermined amount of expansion of predetermined information symbols prior to indicating a change between said statistical encoding tables.

6. A system for compressing byte formatted data to produce compressed data and decompressing said compressed data to produce decompressed byte formatted data comprising:
   run length encoding means for producing run length encoded data having a character byte, a flag byte and a run length byte;
   lookup table means for statistically encoding said run length encoded data to produce said compressed data in accordance with a predetermined statistical encoding lookup table selected from several statistical encoding lookup tables by a pointer signal generated from said predetermined statistical encoding lookup table during a previous statistical encoding process and stored in said predetermined statistical encoding lookup table at address locations corresponding to said run length encoded data being statistically encoded;
   lookup table means for statistically decoding said compressed data to produced statistically decoded data in accordance with a predetermined statistical decoding lookup table selected from several statistical decoding lookup tables by a pointer signal generated from said predetermined statistical decoding lookup table during a previous statistical decoding process and stored at address locations corresponding to said compressed data received from said storage device;
   run length decoding means for run length decoding said statistically decoded data comprising a character byte, a flag byte and a run length byte to produce said decompressed byte formatted data.

7. The system of claim 6 further comprising:
   means for detecting the occurrence of byte formatted data corresponding to said flag byte;
   means for encoding said byte formatted data corresponding to said flag byte as a double flag byte to distinguish said flag byte from said byte formatted data corresponding to said flag byte.

8. The system of claim 7 wherein said previous statistical encoding process comprises a statistical encoding process occurring immediately prior to said statistical encoding of said run length encoded data, and said previous statistical decoding process comprises a statistical decoding process occurring immediately prior to said statistical decoding of said compressed data.

9. The system of claim 8 wherein said several statistical encoding tables comprise:
   null table means for generating said compressed data having a statistical probability which is independent of the occurrence of said run length encoded data;
   generic table means for statistically encoding said run length encoded data to maximize compression of letter character text;
   numeric table means for statistically encoding said run length encoded data to maximize compression of numerical character text.

10. A system for statistically encoding information symbols in a data stream comprising:
    multiple statistical encoding table means for compression of a current information symbol in said data stream of said information symbols in accordance with a specified statistical encoding table which is one of a plurality of statistical encoding tables having statistical encoding data stored therein corresponding to a plurality of classifications of said information symbols;
    means for selecting said specified statistical encoding table based upon a predetermined classification of a previous information symbol chronologically immediately prior to said current information symbol, said predetermined classification of said previous information symbol corresponding to one of said plurality of classifications.

11. A system for statistically encoding information symbols in a data stream comprising:
    multiple statistical encoding table means for compression of a current information symbol in said data stream of said information symbols in accordance with a specified statistical encoding table which is one of a plurality of statistical encoding tables having statistical encoding data stored therein corresponding to a plurality of classifications of said information symbols;

means for selecting said specified statistical encoding table based upon a predetermined classification of a previous information symbol corresponding to one of said plurality of classifications;

means for storing a pointer signal with said previous information symbol to select said specified statistical encoding table based upon said predetermined classification of said previous information symbol.

12. The system of claim 11 wherein said multiple statistical encoding table means comprises lookup tables which store said statistical encoding data at address locations corresponding to said information symbols.

13. A system for statistically encoding information symbols in a data stream comprising:

multiple statistical encoding table means for compression of a current information symbol in said data stream of said information symbols in accordance with a specified statistical encoding table which is one of a plurality of statistical encoding tables having statistical encoding data stored therein corresponding to a plurality of classifications of said information symbols, said multiple statistical encoding table means comprising;

null table means for storing said statistical encoding data having a statistical probability which is independent of the occurrence of said information symbols;

generic table means for storing said statistical encoding data having a statistical probability to increase compression of letter character text;

numeric table means for storing said statistical encoding data having a statistical probability to increase compression of number character text; and, means for selecting said specified statistical encoding table based upon a predetermined classification of a previous information symbol corresponding to one of said plurality of classifications.

14. A system for run length encoding byte formatted data comprising:

means for generating a character byte identifying a repeated byte of said byte formatted data;

means for generating a run length byte indicating a number of repeated bytes in a run of said byte formatted data;

means for generating a flag byte consisting of a nonfrequently occurring byte of said byte formatted data, said flag byte sequentially disposed between said character byte and said run length byte;

means for generating a double flag byte during run length encoding of said nonfrequently occurring byte selected as said flag byte to distinguish said flag byte from said nonfrequently occurring byte in said formatted data.

15. A method of compressing information symbols comprising the steps of:

run length encoding said information symbols to produce a data stream of run length encoded symbols having a character symbol indicating a repeated symbol of said information symbols, a flag symbol indicating the existence of said repeated symbol in said run length encoded data and a run length symbol indicating a number of said repeated symbols in a run of said run length encoded symbol;

statistically encoding said data stream of said run length encoded symbols by a plurality of statistical encoding tables having statistical encoding data stored therein for statistically encoding said run length encoded symbols in accordance with predetermined classifications of said run length encoded symbols;

selecting a specified statistical encoding table of said plurality of said statistical encoding tables for a current run length encoded symbol based upon a specified classification of a previous run length encoded symbol which is chronologically previous to said current run length encoded symbol in said data stream of said run length encoded symbols; and, storing a pointer signal with said statistical encoding table to select said specified statistical encoding table.

16. The method of claim 15 further comprising the step of:

providing lookup tables for storing said statistical encoding data at address locations corresponding to said run length encoded symbols.

17. A method of compressing and decompressing information symbols comprising the steps of:

run length encoding said information symbols to produce a data stream of run length encoded symbols having a character symbol identifying a repeated symbol of said information symbols, a flag symbol byte indicating the existence of a run, and a run length symbol indicating a number of repeated symbols of said run length encoded data;

statistically encoding a current run length encoded symbol in said data stream of said run length encoded symbols with a specified compression table which is one of a plurality of compression tables having statistical encoding data stored therein for statistically encoding said run length encoded symbols in accordance with a predetermined classification of said run length encoded symbols to produce compressed data comprising the steps of:

reading said current run length encoded data symbol as an address code in a lookup table having said statistical encoding data stored at an address location corresponding to said address code;

generating a statistical translation output from said statistical encoding data stored at said address location;

generating a pointer signal from pointer signal data stored at said address location;

determining if said current run length encoded data symbol is a first symbol of said data stream;

selecting a predetermined compression table for said first symbol;

selecting said specified compression table in accordance with said pointer signal generated for said previous run length encoded symbol for data other than said first symbol;

selecting said specified compression table based upon said predetermined classification of a previous run length encoded symbol which is chronologically previous to said current run length encoded symbol in said data stream of said run length encoded symbol;

statistically decoding said compressed data to produce statistically decoded data using one of a plurality of statistical decoding tables selected in accordance with a selection process dependent upon the order of said compressed data such that selection data of said selection process is inherent in said order of said compressed data; and, run length decoding said statistically decoded data to produce decompressed information symbols.

* * * * *